United States Patent
Li et al.

(10) Patent No.: US 9,279,185 B2
(45) Date of Patent: Mar. 8, 2016

(54) FEED-THROUGH APPARATUS FOR A CHEMICAL VAPOUR DEPOSITION DEVICE

(75) Inventors: Zilan Li, Singapore (SG); Teng Hock Kuah, Singapore (SG); Chidambaram Palaniappan, Singapore (SG); Ravindra Raghavendra, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 727 days.

(21) Appl. No.: 13/523,124

(22) Filed: Jun. 14, 2012

(65) Prior Publication Data

US 2013/0333620 A1    Dec. 19, 2013

(51) Int. Cl.
*C23C 16/455* (2006.01)

(52) U.S. Cl.
CPC ..... *C23C 16/45563* (2013.01); *C23C 16/45587* (2013.01); *C23C 16/45589* (2013.01); *Y10T 137/85938* (2015.04)

(58) Field of Classification Search
CPC .............. C23C 16/45563; C23C 16/45587; C23C 16/45589
USPC .............................. 118/715, 733; 156/345.33
See application file for complete search history.

(56) References Cited

U.S. PATENT DOCUMENTS

| | | | | |
|---|---|---|---|---|
| 4,054,293 A * | 10/1977 | Hoeg | F16J 15/43 | 277/347 |
| 4,792,113 A * | 12/1988 | Eidsmore | F16K 17/24 | 137/460 |
| 5,359,148 A * | 10/1994 | Okase | C23C 16/4401 | 118/715 |
| 5,421,892 A * | 6/1995 | Miyagi | C23C 16/46 | 118/724 |
| 5,450,169 A * | 9/1995 | Hart | G03G 15/0898 | 399/104 |
| 5,659,445 A * | 8/1997 | Yoshida | F16C 17/026 | 310/90 |
| 5,676,472 A * | 10/1997 | Solomon | B25J 19/0075 | 277/347 |
| 5,772,833 A * | 6/1998 | Inazawa | H01J 37/32082 | 156/345.47 |
| 5,775,169 A * | 7/1998 | Solomon | B25J 19/0075 | 277/412 |
| 5,820,104 A * | 10/1998 | Koyano | F16K 51/02 | 251/129.15 |
| 5,826,885 A * | 10/1998 | Helgeland | F16J 15/43 | 277/302 |
| 5,954,342 A * | 9/1999 | Mikhalev | F16J 15/43 | 277/347 |
| 5,955,934 A * | 9/1999 | Raj | H01F 7/088 | 335/229 |
| 5,969,589 A * | 10/1999 | Raj | H01F 7/088 | 335/229 |
| 6,030,457 A * | 2/2000 | Shimazu | C23C 16/4401 | 118/715 |
| 6,119,553 A * | 9/2000 | Yamagishi | F16C 16/4401 | 277/410 |
| 6,192,603 B1 * | 2/2001 | Seita | H01L 21/67017 | 310/90 |
| 6,235,121 B1 * | 5/2001 | Honma | C23C 16/4401 | 118/715 |
| 6,461,484 B2 * | 10/2002 | Yo | C23C 14/225 | 204/192.12 |
| 6,616,816 B2 * | 9/2003 | Sakai | C23C 14/351 | 118/730 |
| 6,689,221 B2 * | 2/2004 | Ryding | C23C 14/505 | 118/724 |

(Continued)

FOREIGN PATENT DOCUMENTS

JP    61084373 A * 4/1986
JP    03044462 A * 2/1991

*Primary Examiner* — Rudy Zervigon
(74) *Attorney, Agent, or Firm* — Ostrolenk Faber LLP

(57) ABSTRACT

A feed-through apparatus for a chemical vapor deposition device including: a feed-through main body; a plurality of runner units; and a feed-through device rotatable with respect to the plurality of runner units within the feed-through main body. Each runner unit has a fluid inlet and an elongated runner for receiving the fluid from the fluid inlet wherein the elongated runner extends spirally on a surface of the runner unit. The feed-through device has a plurality of feed-through device orifices for receiving fluids from corresponding elongated runners during rotation of the feed-through device and has outlet-orifices for releasing the fluids into a reactor chamber.

15 Claims, 16 Drawing Sheets

(56) References Cited

U.S. PATENT DOCUMENTS

| | | | |
|---|---|---|---|
| 6,772,710 B2* | 8/2004 | Lee | C23C 16/30 118/305 |
| 7,381,274 B2* | 6/2008 | Lee | C23C 16/4401 118/715 |
| 8,840,726 B2* | 9/2014 | Li | C23C 16/303 118/715 |
| 2001/0003271 A1* | 6/2001 | Otsuki | C23C 4/105 118/723 I |
| 2003/0044533 A1* | 3/2003 | Lee | C23C 16/30 427/255.28 |
| 2004/0255858 A1* | 12/2004 | Lee | C23C 16/4401 118/715 |
| 2006/0090705 A1* | 5/2006 | Kim | C23C 14/046 118/726 |
| 2007/0095286 A1* | 5/2007 | Baek | C23C 16/4412 118/719 |

* cited by examiner

FEED-THROUGH APPARATUS FOR A CHEMICAL VAPOUR DEPOSITION DEVICE

FIELD OF INVENTION

The application relates to a feed-through apparatus for depositing a thin film onto a substrate, such as a semiconductor wafer.

BACKGROUND OF THE INVENTION

Thin-film deposition techniques are used to deposit a film of material onto semiconductor substrates for manufacturing integrated circuit devices and optoelectronic devices on the semiconductor substrates.

For instance, Metal-Organic Chemical Vapour Deposition (MOCVD) is a method of depositing a material on a heated substrate, such as a semiconductor wafer. The method comprises a step of introducing precursor gases into a reactor, which has a temperature-controlled environment. The introduced precursor gases are usually directed to a direction, which is perpendicular or is parallel to a major planar surface of the heated substrate. These precursor gases are also introduced close to the major planar surface and close to each other such that the precursor gases chemically react to deposit a material on the major planar surface of the heated substrate, rather depositing on other parts of the reactor.

As an example, the precursor gases include a first precursor gas and a second precursor gas. The first precursor gas includes a Group III element, such as gallium (Ga), while the second precursor gas includes a Group V element, such as nitrogen (N). These precursor gases react to deposit a compound semiconductor, such as GaN, on a planar surface of the heated substrate.

Carrier gases, such as nitrogen (N2) and hydrogen (H2), are also introduced into the reactor to move the precursor gases towards the heated substrate for minimising the deposition of the precursor gases on unwanted areas within the reactor. These carrier gases also act as purging gases for moving these precursor gases out of the reactor.

It is an object of this application to provide an improved apparatus for introducing gases into a reaction chamber for thin-film deposition, in particular for chemical vapour deposition (CVD).

SUMMARY OF THE INVENTION

The application provides a feed-through apparatus for a reaction chamber for chemical vapour deposition (CVD). The reaction chamber is also called reactor. The feed-through apparatus includes a feed-through main body, a plurality of runner units, and a rotatable feed-through device.

A feed-through apparatus for a chemical vapour deposition device is disclosed. The feed-through apparatus includes: i) a feed-through main body; ii) a plurality of runner units; and iii) a feed-through device rotatable with respect to the plurality of runner units. The runner units are provided within the feed-through main body, and each runner unit comprises a fluid inlet for receiving a fluid, and an elongated runner in fluid communication with the fluid inlet for receiving the fluid from the fluid inlet wherein the elongated runner extends spirally on a surface of the runner unit. The feed-through device comprises a plurality of feed-through device fluid channels, which comprise feed-through device fluid transfer orifices for receiving fluids from corresponding elongated runners and feed-through device fluid outlet-orifices for releasing the fluids to a spinner device. In particular, each feed-through device fluid transfer orifice is in fluid communication with a corresponding elongated runner during rotation of the feed-through device for receiving fluid from the corresponding elongated runner, and each feed-through device fluid outlet orifice is provided for releasing the fluid into a reactor chamber.

BRIEF DESCRIPTION OF THE DRAWINGS

Embodiments of the present invention will now be described, by way of example only, with reference to the accompanying drawings, of which:

FIG. 1 illustrates a perspective view of a feed-through apparatus;

FIG. 2 illustrates a front view of the feed-through apparatus of FIG. 1;

FIG. 3 illustrates a cross-sectional view of the feed-through apparatus of FIG. 1 viewed along section A-A of FIG. 2;

FIG. 4 illustrates a detailed cross-sectional view of an upper part of the feed-through apparatus of FIG. 1;

FIG. 5 illustrates a detailed cross-sectional view of the a lower part of the feed-through apparatus of FIG. 1;

FIG. 9 illustrates a perspective view of a groove of the inner shaft for attaching with the spinner of the feed-through apparatus of FIG. 1;

FIG. 10 illustrates a perspective view of a locking pin of the spinner for attaching with the inner shaft of FIG. 9;

FIG. 11 illustrates a cross-sectional view of a sliding key and a sliding groove of the inner shaft of the feed-through apparatus of FIG. 1;

FIG. 12 illustrates an expanded view of the sliding key and the sliding groove of FIG. 11;

FIG. 13 illustrates a cross-sectional view of coolant channels of the inner shaft of the feed-through apparatus of FIG. 1;

FIG. 14 illustrates a coolant ring of the spinner of the feed-through apparatus of FIG. 1;

FIG. 16 illustrates a cross-sectional view of a further feed-through apparatus; and FIG. 17 illustrates a bottom view of a gas path plate unit of the feed-through apparatus of FIG. 16.

DETAILED DESCRIPTION OF THE DRAWINGS

Figure 1:
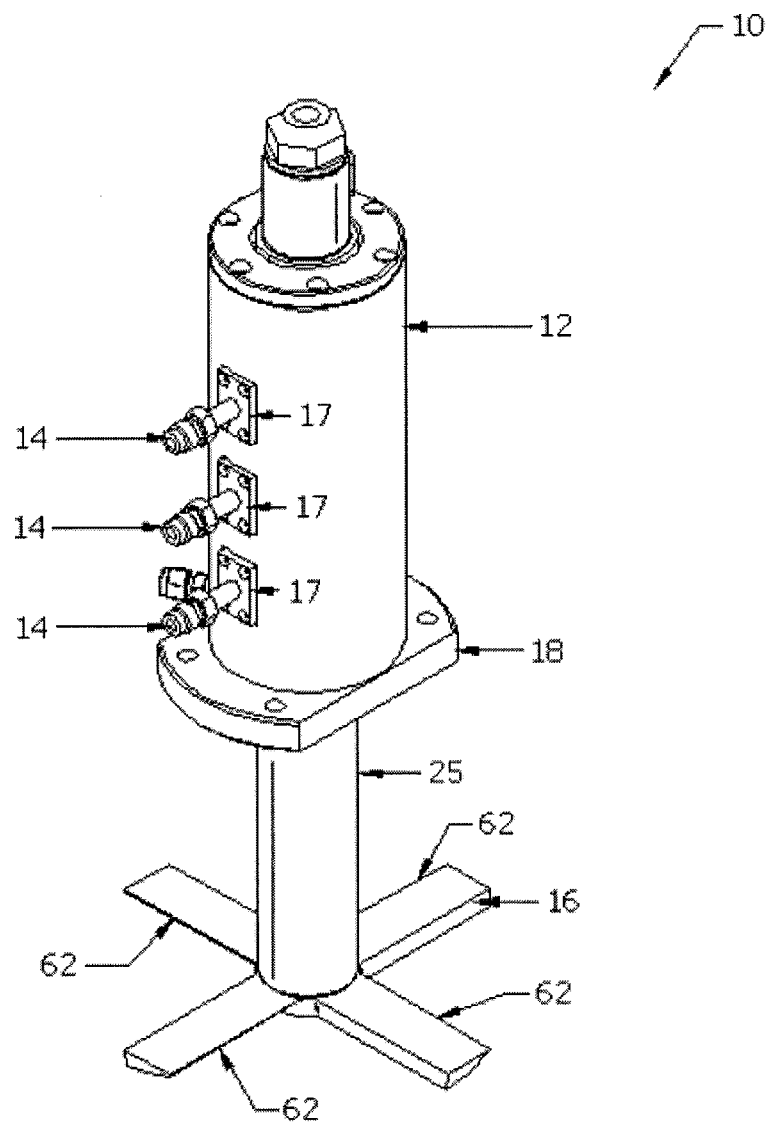
FIGS. 1 to 5 illustrate one embodiment of an improved feed-through apparatus.
Figure 2:
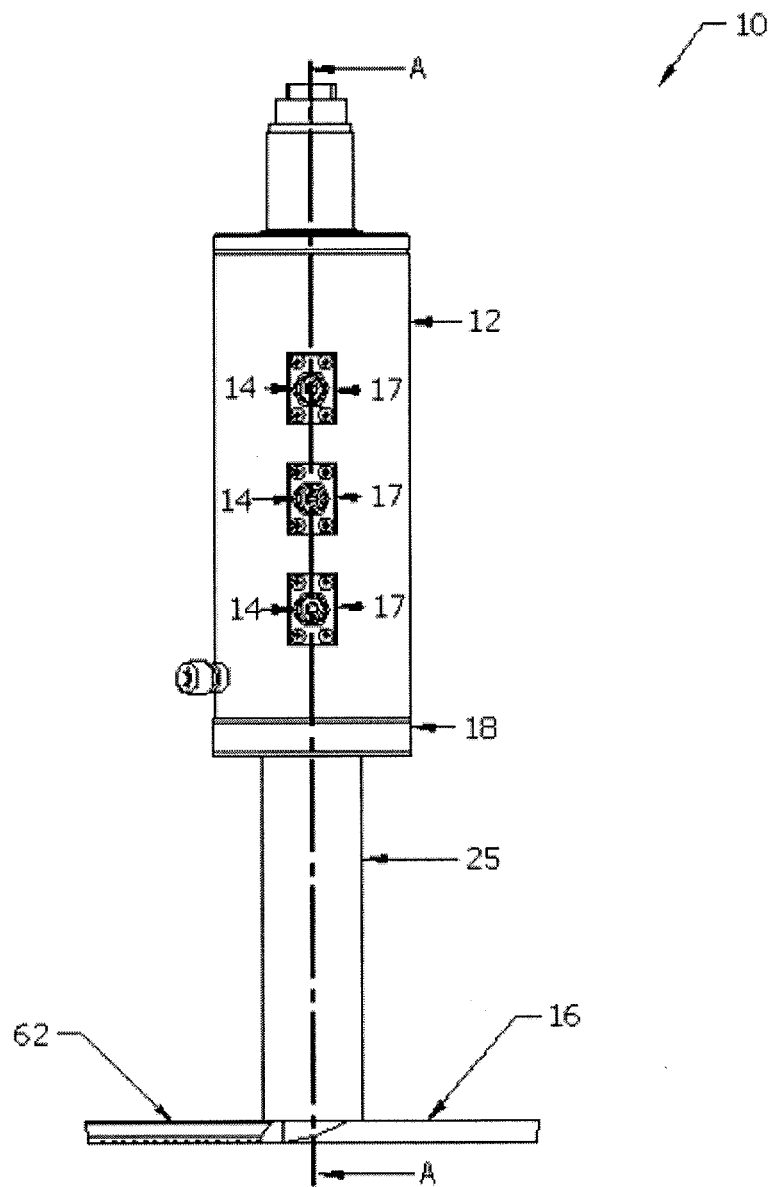

In the following description, details are provided to describe embodiments of the application. It shall be apparent to one skilled in the art, however, that the embodiments may be practiced without such details.

Some parts of the embodiments, which are shown in the drawings have similar parts. The similar parts have same names or similar part numbers with a prime symbol or with an alphabetic symbol. The description of such similar parts also applies by reference to other similar parts, where appropriate, thereby reducing repetition of text without limiting the disclosure.

FIGS. 1 to 5 show different views of a feed-through apparatus 10 for a Chemical Vapour Deposition (CVD) apparatus. The feed-through apparatus 10 includes a feed-through main body 12, a plurality of gas inlets 14, a rotatable feed-through shaft 25, and a rotatable spinner 16 connected to the rotatable feed-through shaft 25.

The gas inlets 14 have base plates 17, which are mounted on an external surface of the feed-through main body 12. A lower part of the feed-through main body 12 has a horizontal mounting flange 18 while a bottom part of the feed-through main body 12 is attached to the spinner 16, which is arranged horizontally.

During assembly of the CVD apparatus, the mounting flange 18 of the feed-through main body 12 is attached to a top surface of a reaction chamber such that the bottom part of the feed-through main body 12 and the spinner 16 is inserted inside the reaction chamber. The reaction chamber is also called reactor. The reaction chamber is not illustrated in the FIGs. The reaction chamber includes a horizontal semiconductor wafer chuck.

Referring to the feed-through apparatus 10, it further includes a plurality of fixed runner units 20 with spiral runners 21, and a plurality of fixed ferro-fluidic seals 23.

The runner units 20 are inserted inside the feed-through main body 12 while the feed-through shaft 25 is inserted inside the runner units 20. The ferro-fluidic seals 23 are placed between the feed-through main body 12 and the feed-through shaft 25. The ferro-fluidic seals 23 are also arranged axially along the feed-through shaft 25 such that each runner unit 20 is placed between two adjacent ferro-fluidic seals 23. A bottom part of the rotatable feed-through shaft 25 is attached to the spinner 16.

Figure 6:
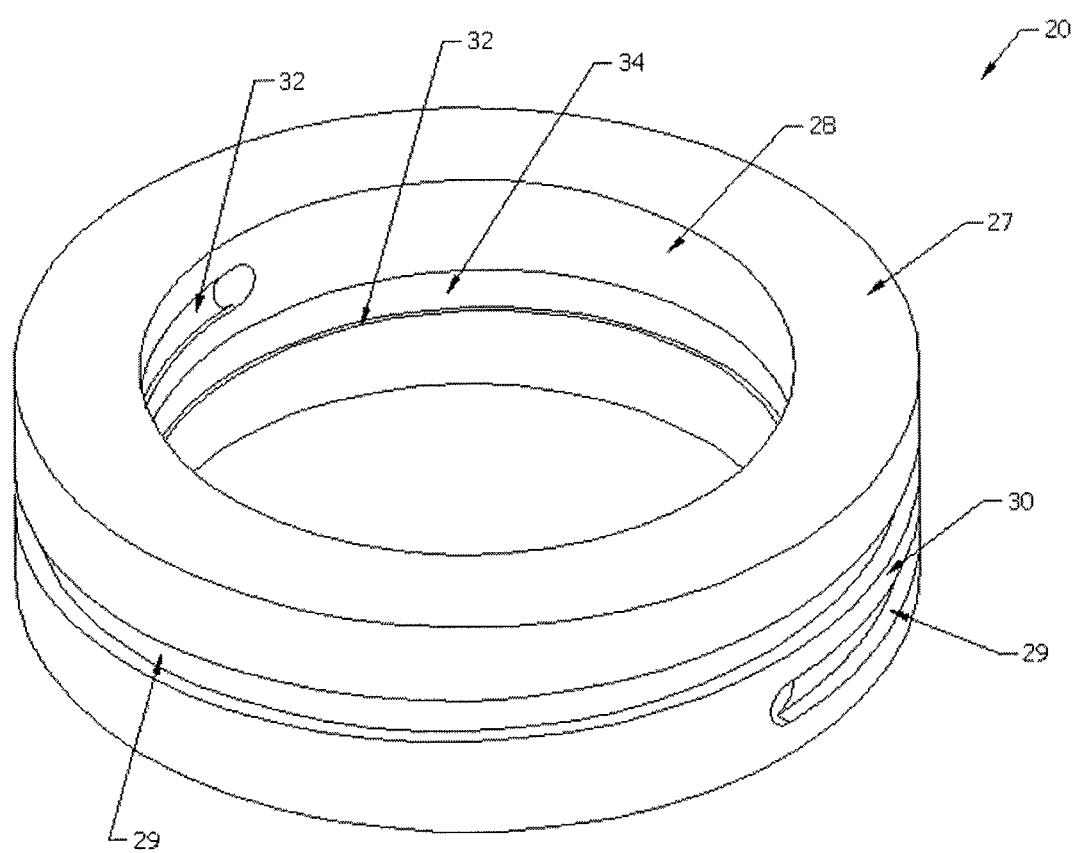
FIG. 6 illustrates a perspective view of one embodiment of a runner unit of the feed-through apparatus of FIG. 1.

FIG. 6 shows one possible embodiment of the runner units 20. FIG. 6 depicts a cylindrical runner unit 20'. The runner unit 20' has an outer runner carrier 27 and an inner runner carrier 28, which is placed inside and next to the outer runner carrier 27.

The outer runner carrier 27 has an elongated external spiral runner 29. The runners are also called tracks or roads. The external spiral runner 29 has two ends and it is placed on an external surface 30 of the outer runner carrier 27, wherein the external spiral runner 29 extends around the said external surface 30. A part of the external spiral runner 29 is placed next to a corresponding gas inlet 14.

Similarly, the inner runner carrier 28 has an elongated internal spiral runner 32 that has two ends. The internal spiral runner 32 is placed in an internal surface 34 of the inner runner carrier 28 and it extends around the said internal surface 34. One end of the external spiral runner 29 is connected to one end of the internal spiral runner 32 via a through-hole while another end of the external spiral runner 29 is connected to another end of the internal spiral runner 32 via another through-hole.

Figure 3:
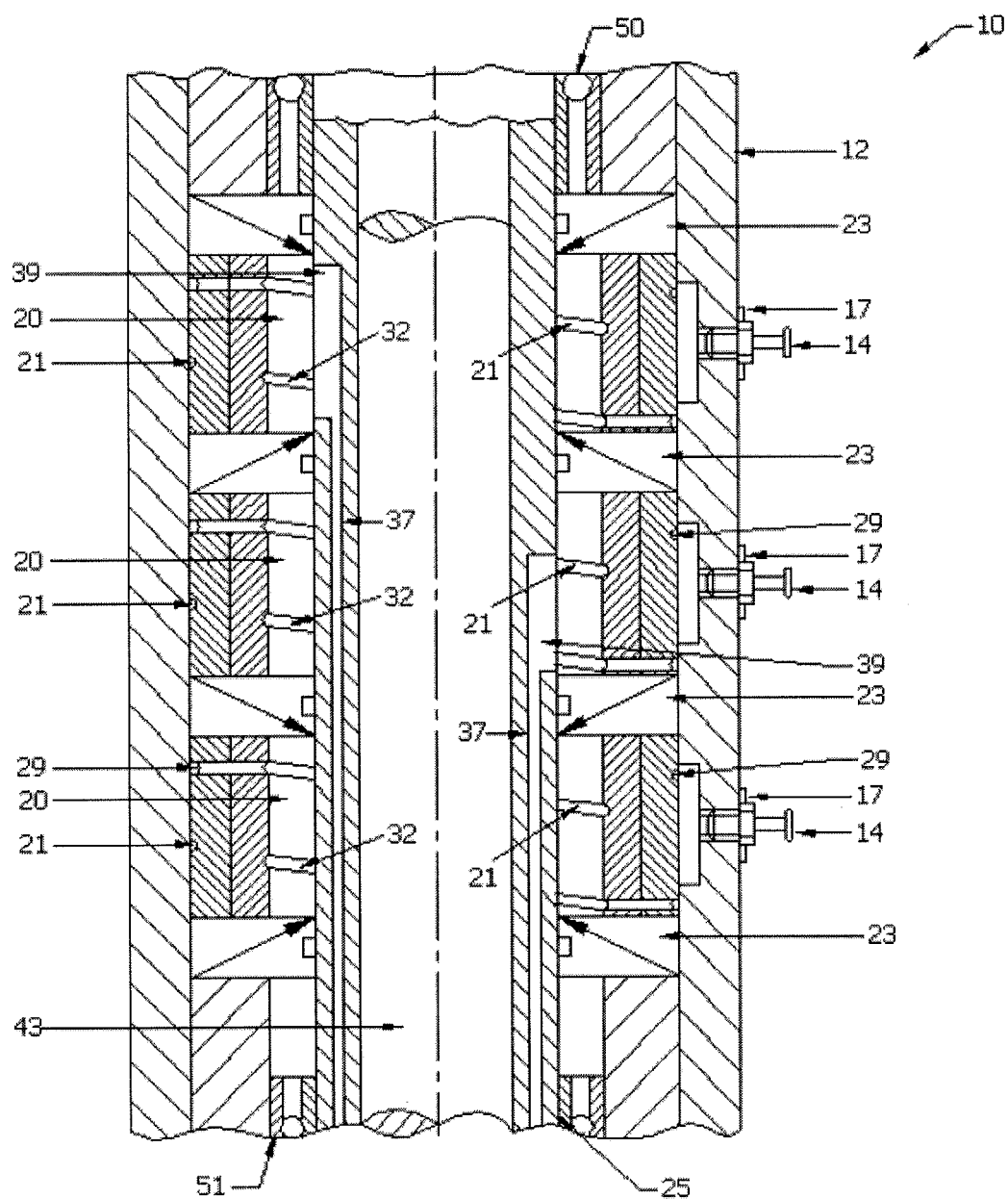

Referring to FIG. 3, the rotatable feed-through shaft 25 is arranged horizontally and it has a plurality of internal gas shaft channels (feed-through device fluid channels) 37. Each gas shaft channel 37 has a gas transfer shaft-orifice (feed-through fluid transfer orifice) 39 and a gas outlet shaft-orifice (feed-through device fluid outlet orifice) 40, wherein both shaft-orifices 39 and 40 are positioned at ends of the gas shaft channel 37. The gas transfer shaft-orifice 39 is also placed next to a corresponding internal spiral runner 32.

The rotatable feed-through shaft 25 also has a hollow core and a rotatable inner shaft 43, which is inserted in the hollow core such that the inner shaft 43 rotates together with the feed-through shaft 25 at the same speed.

A nut and bolt assembly 45 releasably attaches a top part of the inner shaft 43 to a top part of the feed-through shaft 25. A middle part of the inner shaft 43 is placed inside the feed-through shaft 25 while the top part of the inner shaft 43 protrudes outside the feed-through shaft 25. The inner shaft top part has screw threads. A nut 44 is screwed onto this screw thread. A washer 46 is placed between the nut 44 and the top part of the feed-through shaft 25. The nut 44 is also tightened to lock the top part of the inner shaft 43 onto the top part of the feed-through shaft 25 via the washer 46.

In a similar manner, a bottom part of the inner shaft 43 is attached to the spinner 16 via a nut and bolt assembly 47.

Figure 4:
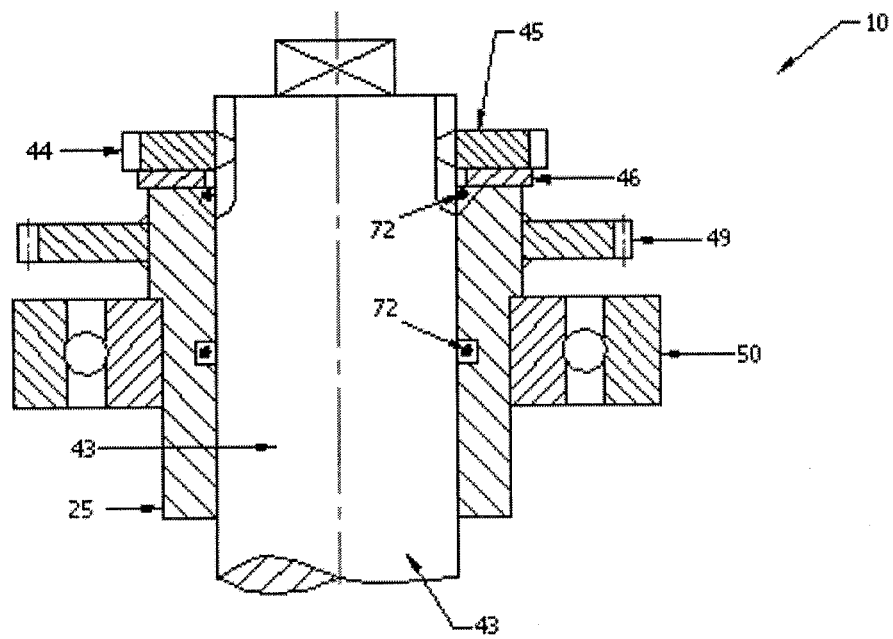
Figure 5:
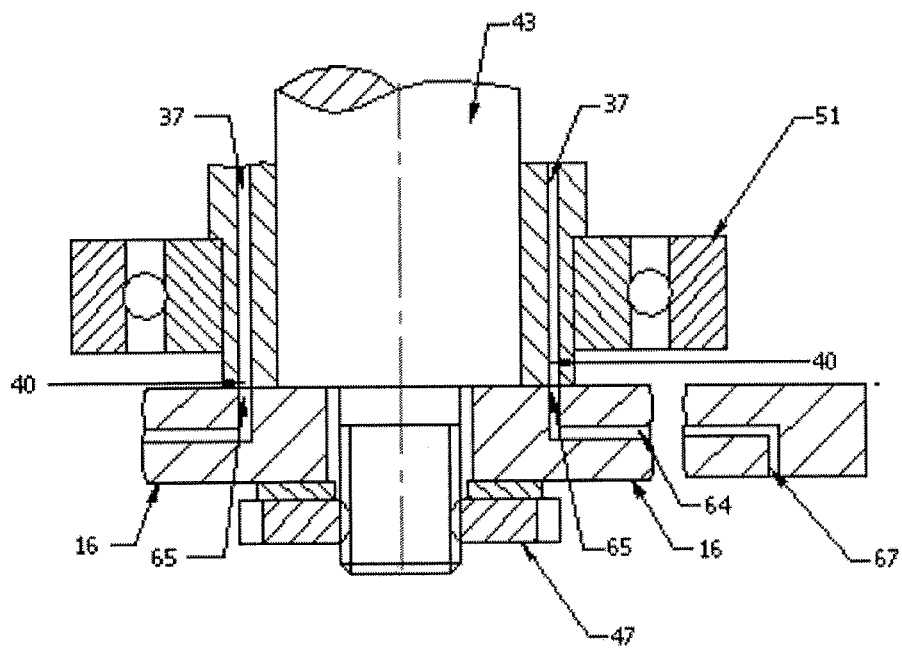

Referring to FIG. 4, an upper part of the feed-through shaft 25 is inserted in a drive wheel 49 and is attached to the drive wheel 49. An upper bearing 50 is placed between the upper part of the feed-through shaft and the feed-through main body 12. Similarly, FIG. 5 shows a lower bearing 51 being placed between the lower part of the feed-through shaft and the feed-through main body 12.

Figure 7:
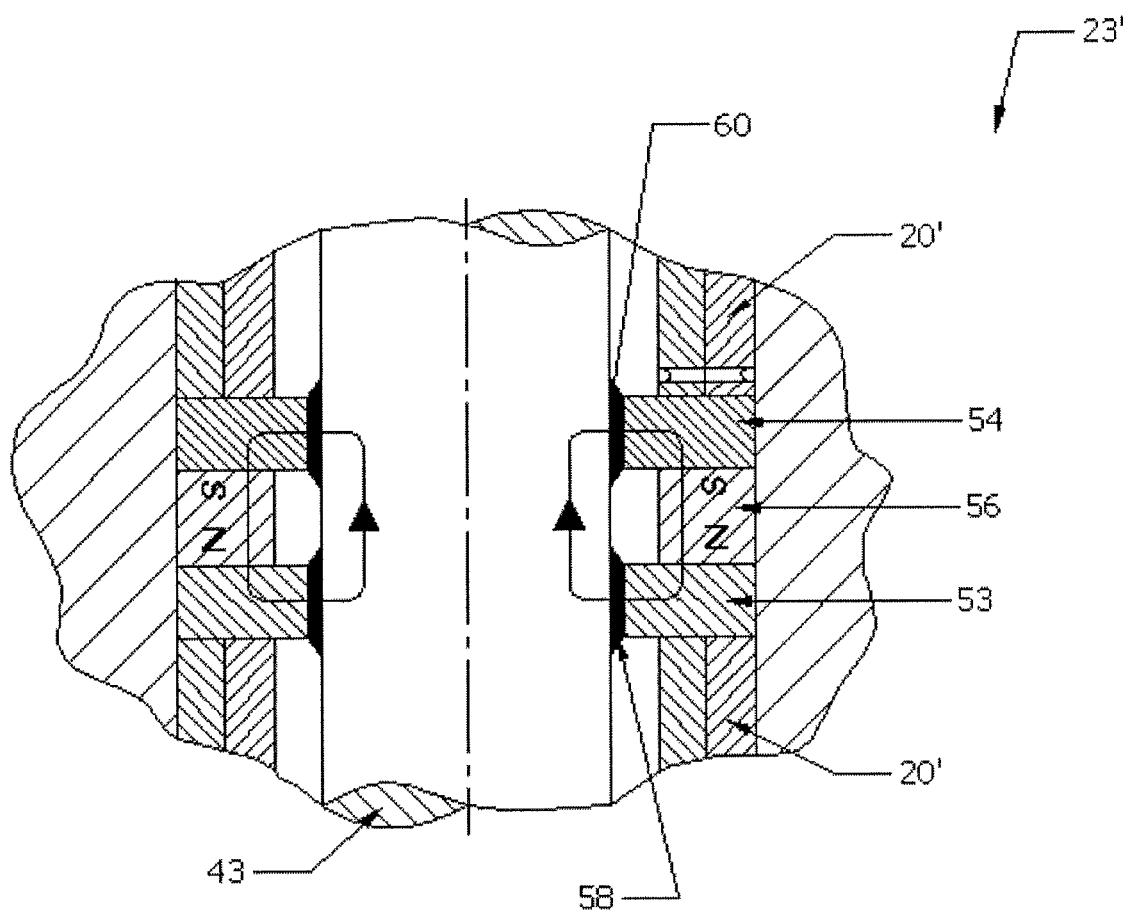
FIG. 7 illustrates a cross-sectional view of one embodiment of a ferro-fluidic sealing device of the feed-through apparatus of FIG. 1.

FIG. 7 shows one embodiment of the ferro-fluidic seals 23. FIG. 7 shows a cylindrical ferro-fluidic seal 23'. The ferro-fluidic seal 23' includes a north ring 53 and a south ring 54, a first circular ferromagnetic fluid layer 58 and a second circular ferromagnetic fluid layer 60, and a ring magnet 56.

The ring magnet 56 is positioned between the north ring 53 and the south ring 54 such that a first surface of the ring magnet 56 is placed next to the north ring 53 while a second surface of the ring magnet 56, being opposite to the first surface, is placed next to the south ring 54.

The first ferromagnetic fluid layer 58 is placed next to an inner surface of the north ring 53. Likewise, the second ferromagnetic fluid layer 60 is placed to an inner surface of the south ring 54.

In a general sense, the ferro-fluidic seal 23 is a form of a magnetic sealing device.

During installation of the feed-through apparatus 10, each runner unit 20 is positioned between two ferro-fluidic seals 23'. The inner shaft 43 is inserted in the north ring 53, in the ring magnet 56, and in the south ring 54 of each ferro-fluidic seal 23'.

Each first ferromagnetic fluid layer 58 is provided between the north ring 53 and the inner shaft 43 such that the first ferromagnetic fluid layer 58 physically contacts the north ring 53 and the inner shaft 43. Likewise, each second ferromagnetic fluid layer 60 is provided between the south ring 54 and the inner shaft 43, such that the second ferromagnetic fluid layer 60 physically contacts the south ring 54 and the inner shaft 43.

In use, the magnetic flux of ferro-fluidic seal 23' flows from its ring magnet 56 to its north ring 53, to its first ferromagnetic fluid layer 58, to the inner shaft 43, to its second ferromagnetic fluid layer 60, to its south ring 54, and to its ring magnet 56.

The ferro-fluidic seal 20' acts as a magnetic sealing device to prevent a gas of one runner unit 20 from mixing with another gas from an adjacent runner unit 20.

Referring to the FIGS. 1 and 5, the spinner (spinner device) 16 includes a plurality of blades 62 extending radially from a central hub of the spinner 16.

Each blade 62 has an internal gas blade channel 64. The internal gas blade channel 64 has a gas transfer blade-orifice 65 and a plurality of gas outlet blade-orifices 67. The gas transfer blade-orifice 65 is placed next to a corresponding gas outlet orifice 40 of the feed-through shaft 25. The gas outlet blade-orifices 67 are placed along an elongated surface of the blade 62.

In a generic sense, the internal gas shaft channel 37 can have one or more gas transfer shaft-orifices 39 and one or more gas outlet shaft-orifices 40. Similarly, the internal gas blade channel 64 can have one or more gas transfer blade-orifices 65 and one or more gas outlet blade-orifices 67.

In use, a motor rotates the drive wheel 49 of the feed-through shaft 25, which then rotates the spinner 16. The upper and lower bearings 50 and 51 allow the feed-through shaft 25 to rotate within the fixed feed-through main body 12.

A wafer chuck within the reaction chamber is used for receiving and supporting one or more semiconductor wafers. The chuck may also heat the semiconductor wafers using a heating means.

Each gas inlet 14 receives a gas from a corresponding gas supply. It should be understood the gas refers to a form of a substance, which is neither solid nor liquid.

Each external spiral runner 29 receives the gas from a corresponding gas inlet 14 and it transports the received gas to a corresponding internal spiral runner 32.

Each gas transfer shaft-orifice 39 receives a gas from a corresponding internal spiral runner 32 while its respective gas shaft channel 37 transports the gas to its corresponding gas outlet shaft-orifice 40.

In effect, the runners 29 and 32 transport a gas in a spiral manner from a corresponding gas inlet 14 to a corresponding internal gas shaft channel 37 while the feed-through shaft 25 is rotating. This manner of transfer allows the gas received by the internal gas shaft channel 37 to have little even pressure.

Each gas transfer blade-orifice 65 receives a gas from a corresponding gas outlet shaft-orifice 40. The corresponding gas blade channel 64 then transports the gas to its respective gas outlet blade-orifice 67, wherein the gas outlet blade-orifice 67 releases the transported gas outside of the associated blade 62 towards the semiconductor wafers on the wafer chuck.

The gases from the different gas inlets 14 interact with each other to deposit a thin film material onto the semiconductor wafers. The different gases mix and react with each other only after they are released from the blades 62 since individual separate paths serve to transport these gases to the blades 62. These paths prevent these gases from mixing or interacting with each other during the transportation.

The spinner 16 rotates to provide a uniform distribution of the gases across upper surfaces of the semiconductor wafers to avoid concentrating the gases on only certain areas of the semiconductor wafers.

The adjacent ferro-fluidic seals 23 act to seal a gas between a runner unit 20 and its corresponding gas transfer shaft-orifice 39 such that the gas does not mix with another gas between an adjacent runner unit 20 and its corresponding gas transfer shaft-orifice 39. In other words, the ferro-fluidic seals 23 prevent fluid leakages.

In a general sense, a liquid or a mixture of gas and liquid can replace the above-mentioned gas.

Figure 8:
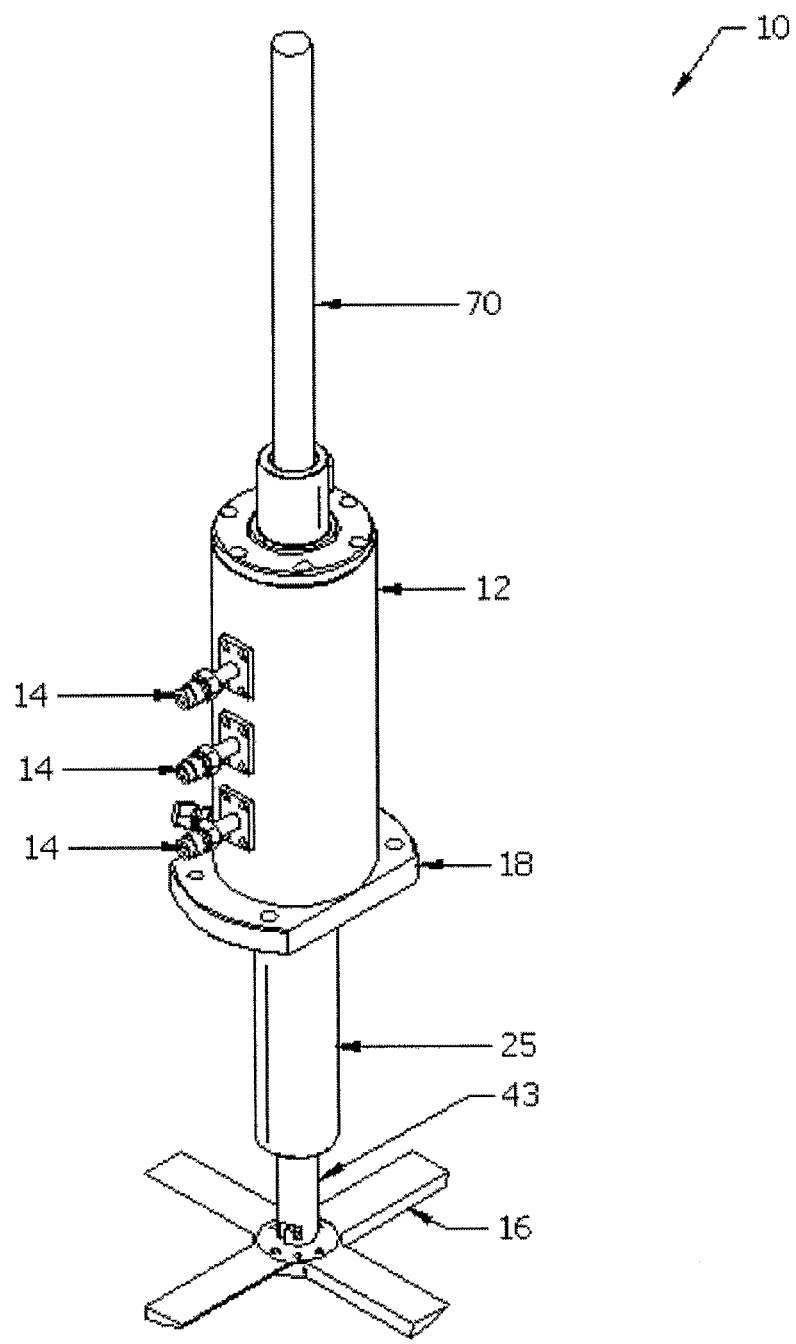
FIG. 8 illustrates a perspective view of one embodiment of an auxiliary extension shaft of the feed-through apparatus of FIG. 1.

FIG. 8 shows auxiliary extension shaft 70 for the feed-through apparatus 10. A bottom part of the auxiliary extension shaft 70 is attached releasably to a top part of the inner shaft 43 of the feed-through apparatus 10.

During maintenance of the feed-through apparatus 10, the nut and bolt assemblies 45 and 47, which are depicted in FIGS. 4 and 5, are released. This allows the inner shaft 43 to move axially while the auxiliary extension shaft 70 allows the inner shaft 43 together with the spinner 16 to be lowered in a controlled manner, as shown in FIG. 8.

One or more round rings 72 are also placed between the feed-through shaft 25 and the inner shaft 43, as shown in FIG. 4. The round rings 72 are often called 0-rings. These round rings 72 act as gaskets to seal gaps between the feed-through shaft 25 and the inner shaft 43 such that they prevent a reaction chamber, which is attached to the feed-through apparatus 10, from being exposed to the surrounding environment.

Figure 9:
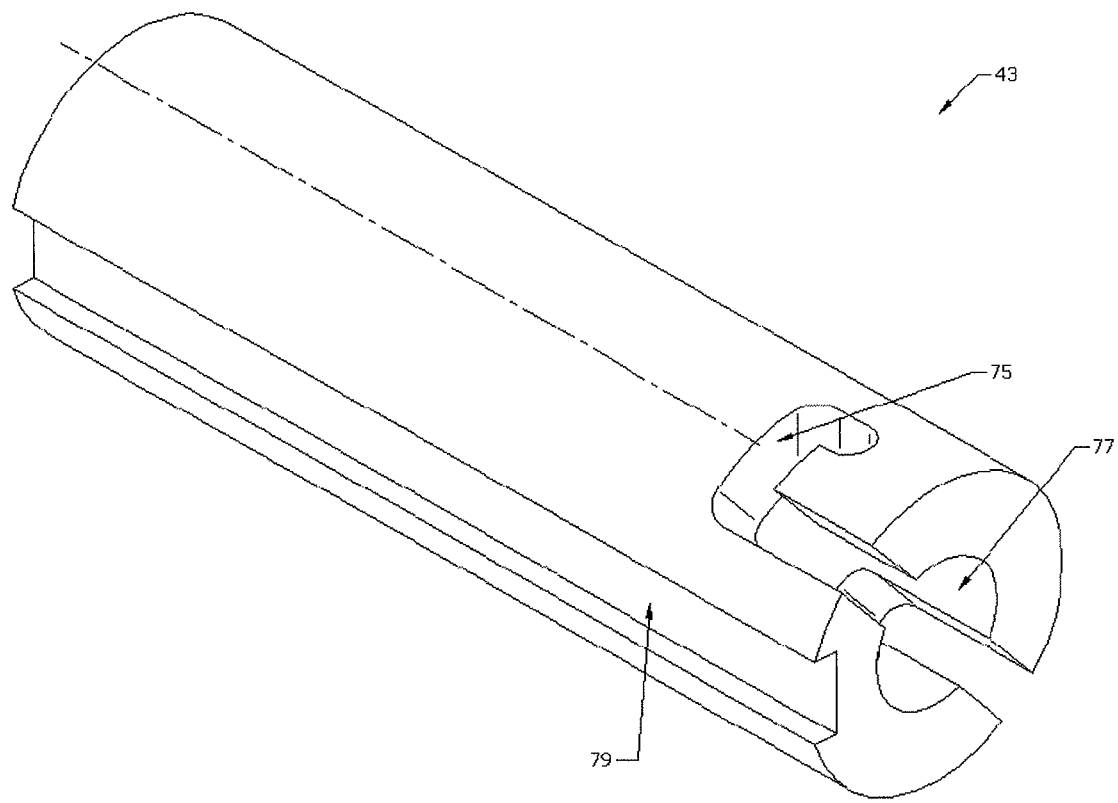
FIGS. 9 and 10 illustrate one embodiment of a connection between an inner shaft and a spinner of the feed-through apparatus of FIG. 1.
Figure 10:
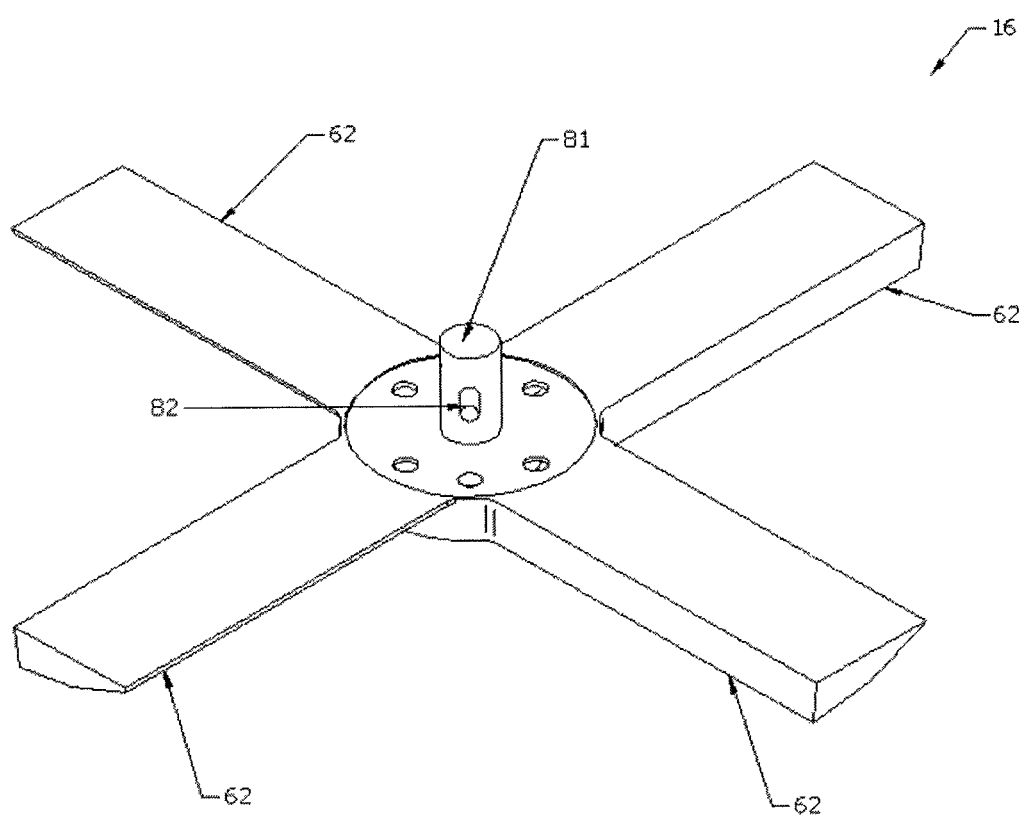

FIGS. 9 and 10 show a connection between the inner shaft 43 and the spinner 16 of the feed-through apparatus 10.

FIG. 9 shows a lower end of the inner shaft 43 with a locking slot 75 that has a central hollow opening 77. The lower end also has an elongated sliding groove 79, which is placed in the longitudinal direction of the inner shaft 43.

FIG. 10 shows the spinner 16 with a hub 81 that has a locking pin 82. One end of each blade 62 is attached radially to the hub 81.

Figure 11:
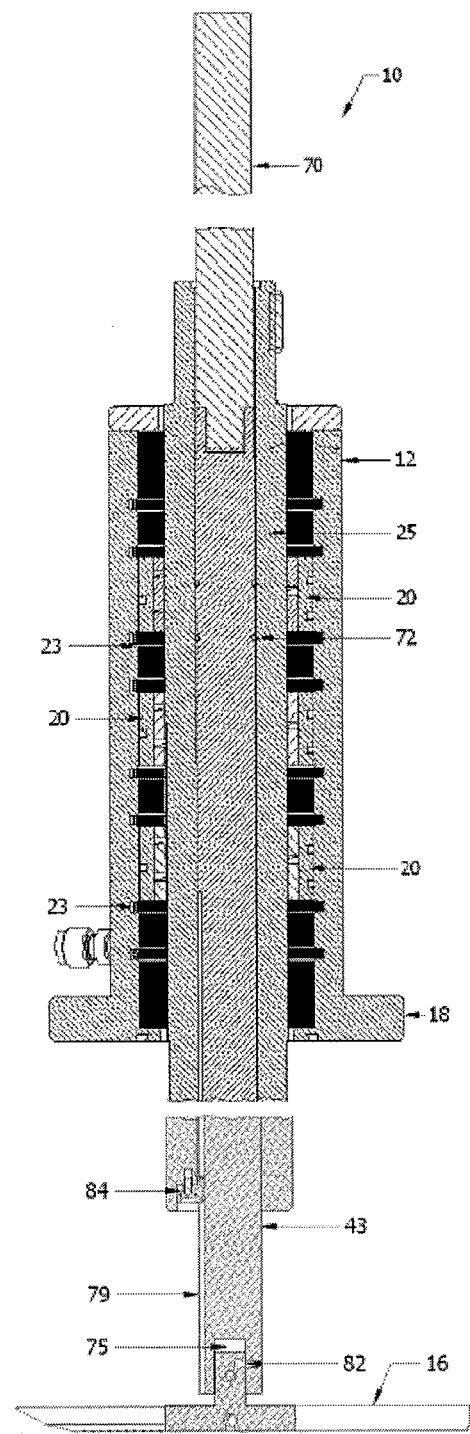
FIGS. 11 and 12 illustrate one embodiment of a device for limiting the lowering of the spinner.

In use, the locking pin 82 is inserted in the central hollow opening 77 such that the locking slot 75 receives the locking pin 82. This reception also causes the spinner 16 to be locked to the inner shaft 43, as shown in FIG. 11. This manner of locking is easy to implement and it does not use screws. In other words, this connection does not introduce screws in a reaction chamber, wherein the screws may alter the flow of gases within the reaction chamber.

Figure 12:
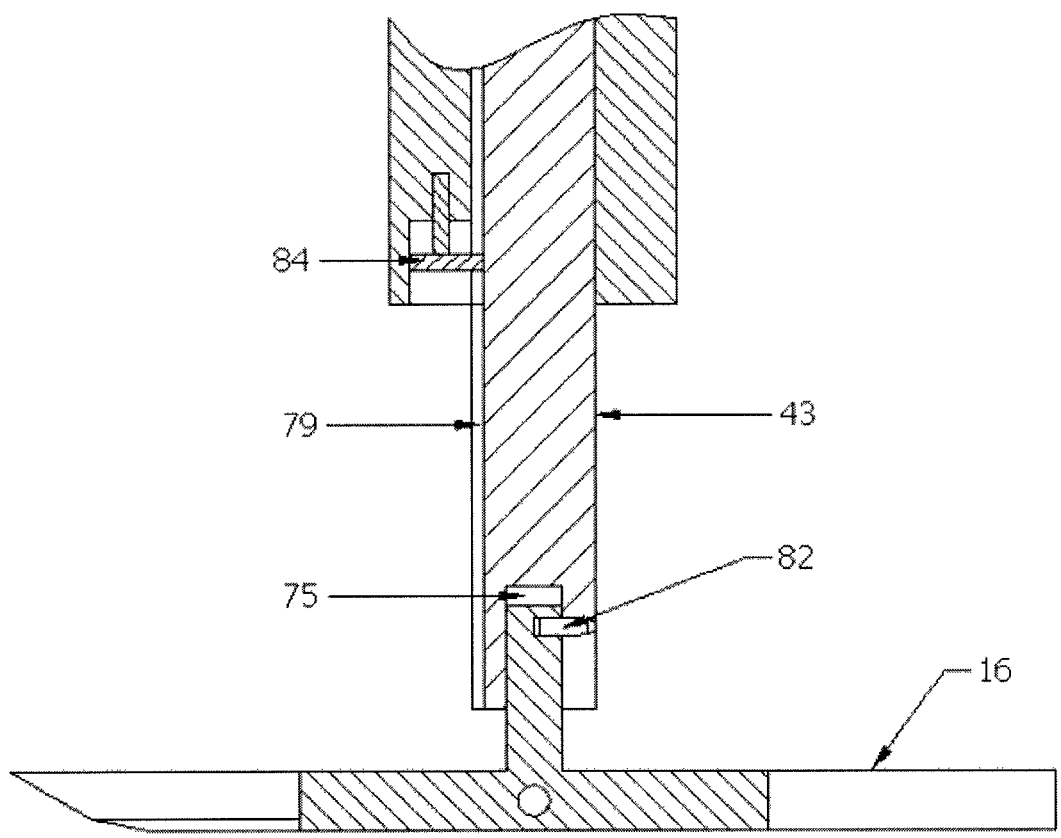

FIG. 11 and FIG. 12 show a sliding key (key) 84 for the sliding groove (groove) 79 of the inner shaft 43. The sliding key 84 is inserted in a bottom opening of the feed-through shaft 25 and is placed next to the sliding groove 79. The sliding key 84 acts to block an upper end of the sliding groove 79 in order to limit the lowering of the spinner 16 during its maintenance.

Figure 13:
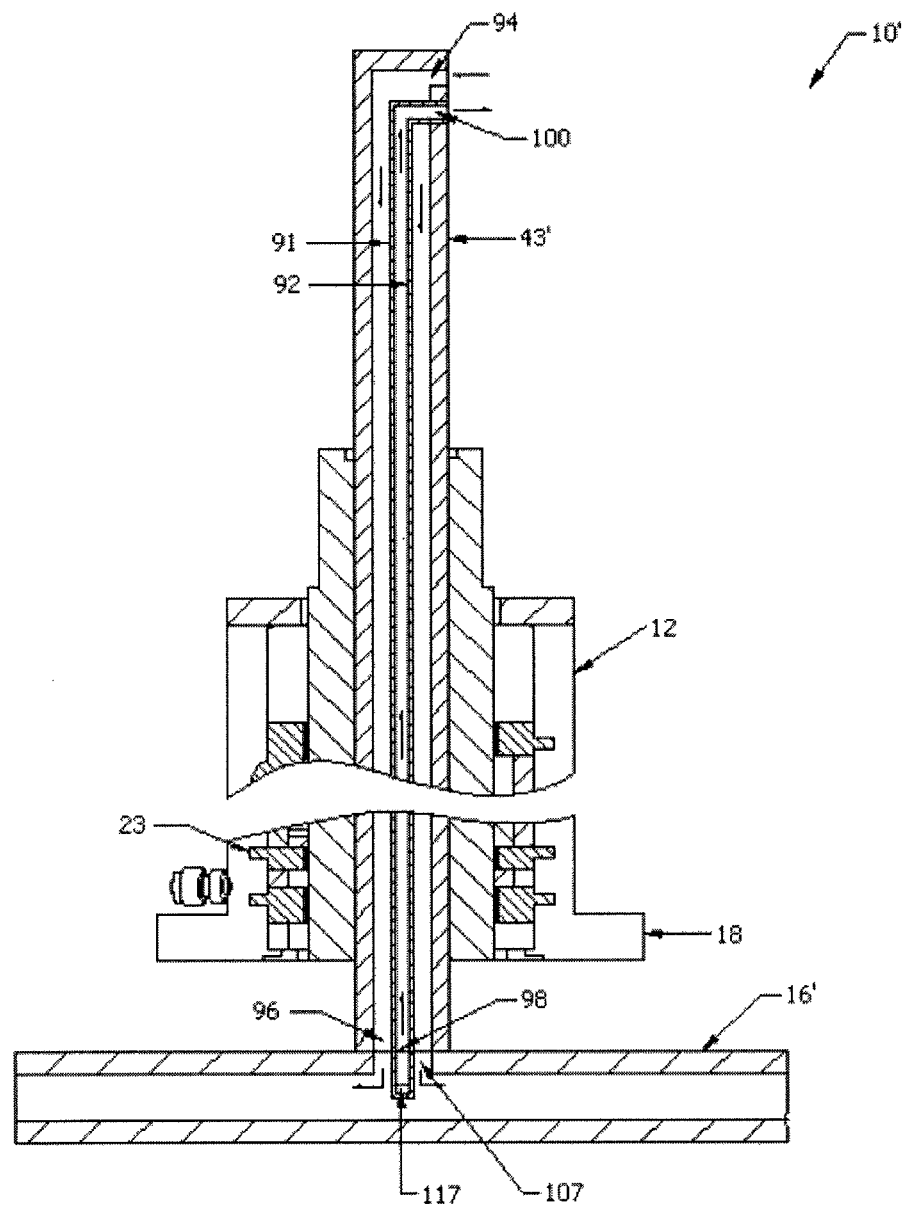
FIGS. 13 to 14 illustrate one embodiment of a coolant module of the feed-through apparatus of FIG. 1.
Figure 14:
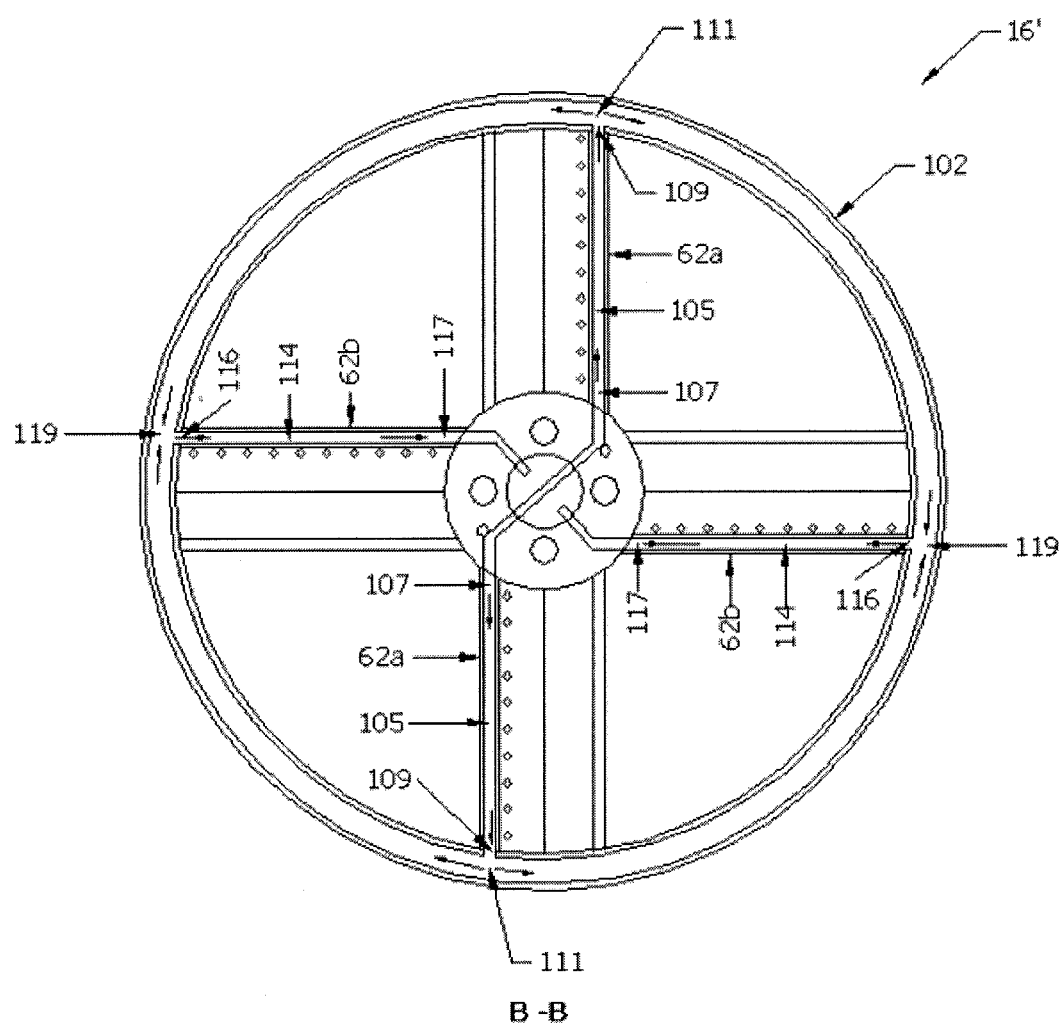
Figure 15:
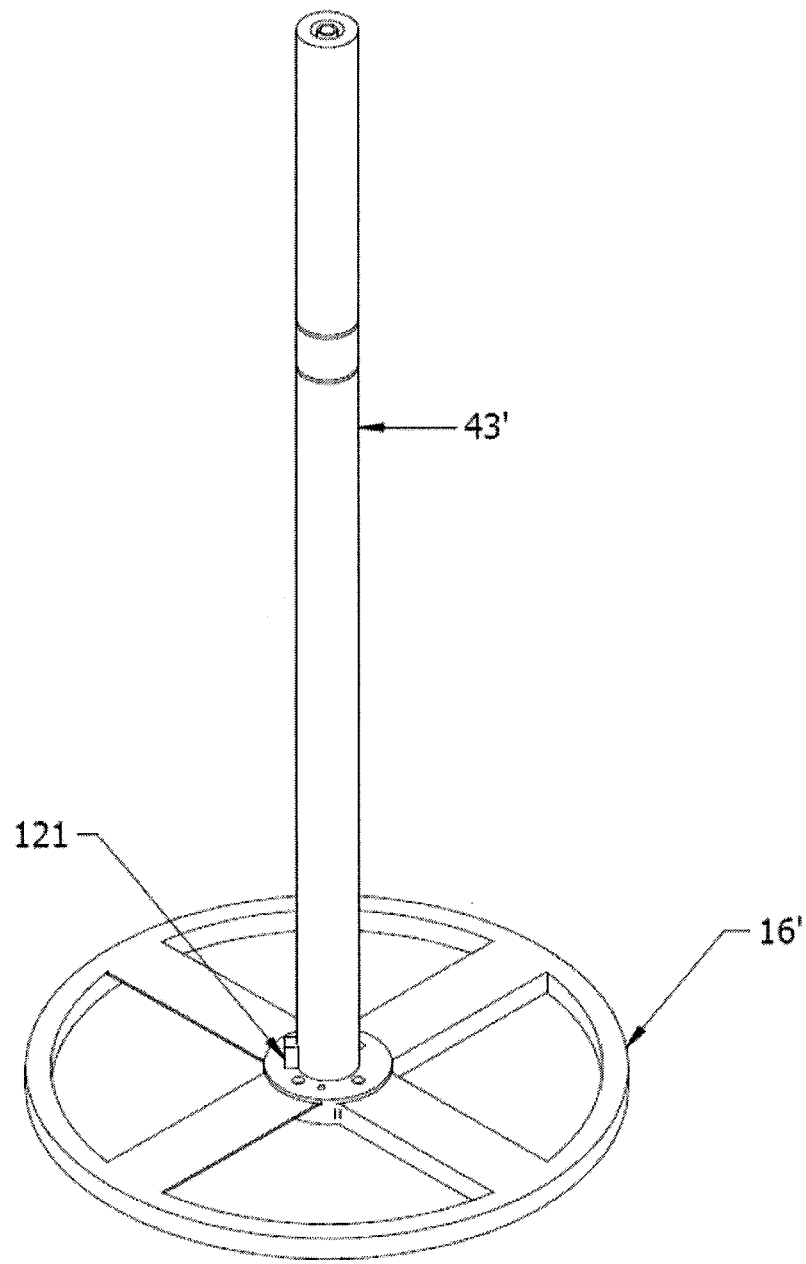
FIG. 15 illustrates a perspective view of one embodiment of an alignment protrusion of the spinner of FIG. 14.

FIGS. 13 to 15 show a coolant module for a feed-through apparatus 10'.

The coolant module includes an inner shaft 43' with inner shaft liquid channels, as illustrated in FIG. 13, and a rotatable spinner 16', as illustrated in FIG. 13 and in FIG. 14.

The inner shaft liquid channels include a first elongated liquid channel (first inner shaft cooling fluid channel) 91 and a second elongated liquid channel (second inner shaft cooling fluid channel) 92. The second shaft liquid channel 92 is placed inside the first shaft liquid channel 91, wherein the shaft liquid channels 91 and 92 have the same longitudinal axis.

The first shaft liquid channel 91 has a first shaft liquid transfer orifice (first inner shaft cooling fluid transfer orifice) 94 and a first shaft liquid outlet orifice (first inner shaft cooling fluid outlet orifice) 96. The first shaft liquid transfer orifice 94 is placed at an upper part of the first shaft liquid channel 91 while first shaft liquid outlet orifice 96 is placed at a lower part of the first shaft liquid channel 91.

In contrast, the second shaft liquid channel 92 has a second shaft liquid transfer orifice (second inner shaft cooling fluid transfer orifice) 98 and a second shaft liquid outlet orifice (second inner shaft cooling fluid outlet orifice) 100. The second shaft liquid transfer orifice 98 is placed at a lower part of the second shaft liquid channel 92 and the second shaft liquid outlet orifice 100 is placed at an upper part of the second shaft liquid channel 92.

Referring to the spinner 16', it includes a hub with a plurality of radial blades, which are connected to a coolant ring 102. Inner ends of the blades are joined to the hub while outer ends of the blades are joined to the coolant ring 102.

The blades include a plurality of first blades 62a and a plurality of second blades 62b.

Each first blade 62a has a first blade liquid channel (first blade cooling fluid channels) 105. The first blade liquid channel 105 includes a first blade liquid channel transfer orifice (first blade cooling fluid transfer orifice, blade fluid transfer orifice) 107 and a first blade liquid channel outlet orifice (first blade cooling fluid outlet orifice, blade fluid outlet orifice) 109. The first blade liquid channel transfer orifice 107 is placed at an inner end of the first blade 62a. It is also placed next to a corresponding first shaft liquid outlet orifice 96. The first blade liquid channel outlet orifice 109 is placed at an outer end of the first blade 62a and also placed next to an inlet 111 of the coolant ring 102.

In contrast, each second blade 62b has a second blade liquid channel (plurality of second blade cooling fluid channels) 114. The second blade liquid channel 114 includes a second blade liquid channel transfer orifice second blade cooling fluid transfer orifice, blade fluid transfer orifice) 116 and a second blade liquid channel outlet orifice (second blade cooling fluid outlet orifice, blade fluid outlet orifice) 117. The second blade liquid channel transfer orifice 116 is placed at an outer end of the second blade 62b and is also placed next to an outlet 119 of the coolant ring 102. The second blade liquid channel outlet orifice 117 is placed at an inner end of the second blade 62b and is also placed next to a corresponding second shaft liquid transfer orifice 98.

In use, the first shaft liquid transfer orifice 94 is used for receiving a coolant liquid from an external coolant liquid source. The first shaft liquid channel 91 transports the coolant liquid from the first shaft liquid transfer orifice 94 to its first shaft liquid outlet orifice 96.

Each first blade liquid channel transfer orifice (blade fluid transfer orifice) 107 receives the coolant liquid from the first shaft liquid outlet orifice 96 while its corresponding first blade liquid channel 105 transports the coolant liquid from its first blade liquid channel transfer orifice 107 to its first blade liquid channel outlet orifice 109.

Each inlet 111 of the coolant ring 102 receives the coolant liquid from a corresponding first blade liquid channel outlet orifice 109 and the coolant ring 102 transports the received coolant liquid to its outlets 119.

Each second blade liquid channel transfer orifice 116 receives the coolant liquid from a corresponding outlet 119. A corresponding second blade liquid channel 114 then transports the coolant liquid to its second blade liquid channel outlet orifice 117.

The second shaft liquid transfer orifice 98 receives the coolant liquid from the second blade liquid channel outlet orifices 117. The second shaft liquid channel 92 then transports the coolant liquid from the second shaft liquid transfer orifice 98 to the second shaft liquid outlet orifice 100.

An external coolant liquid sink receives the coolant liquid from the second shaft liquid outlet orifice 100.

The coolant liquid serves to remove heat from the feed-through apparatus 10'. A reaction chamber, which is attached to the feed-through apparatus 10', may generate heat while performing a high temperature process. The coolant liquid is then used to control the temperature of the spinner 16'.

The coolant ring 102 provides a reliable way of cooling the spinner 16'.

In a general sense, the coolant liquid can be replaced by a coolant gas or by a mixture of coolant liquid and of coolant gas.

FIG. 15 shows an alignment protrusion 121 of a spinner 16'. The protrusion 121 allows easy alignment of the spinner 16' to an inner shaft 43' during attachment of the spinner 16' to the inner shaft 43'

Figure 16:
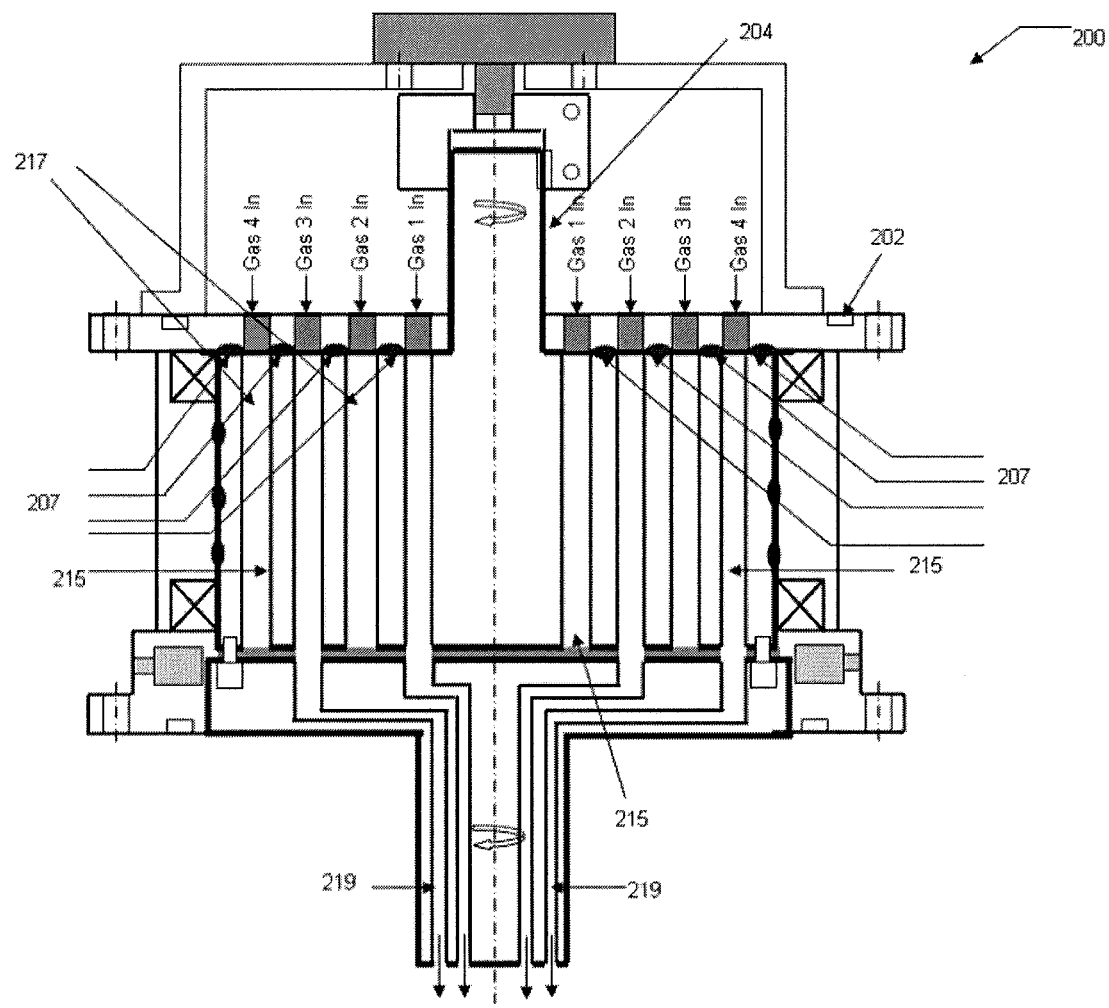
FIGS. 16 to 17 illustrate a variation of the feed-through apparatus of FIG. 1.
Figure 17:
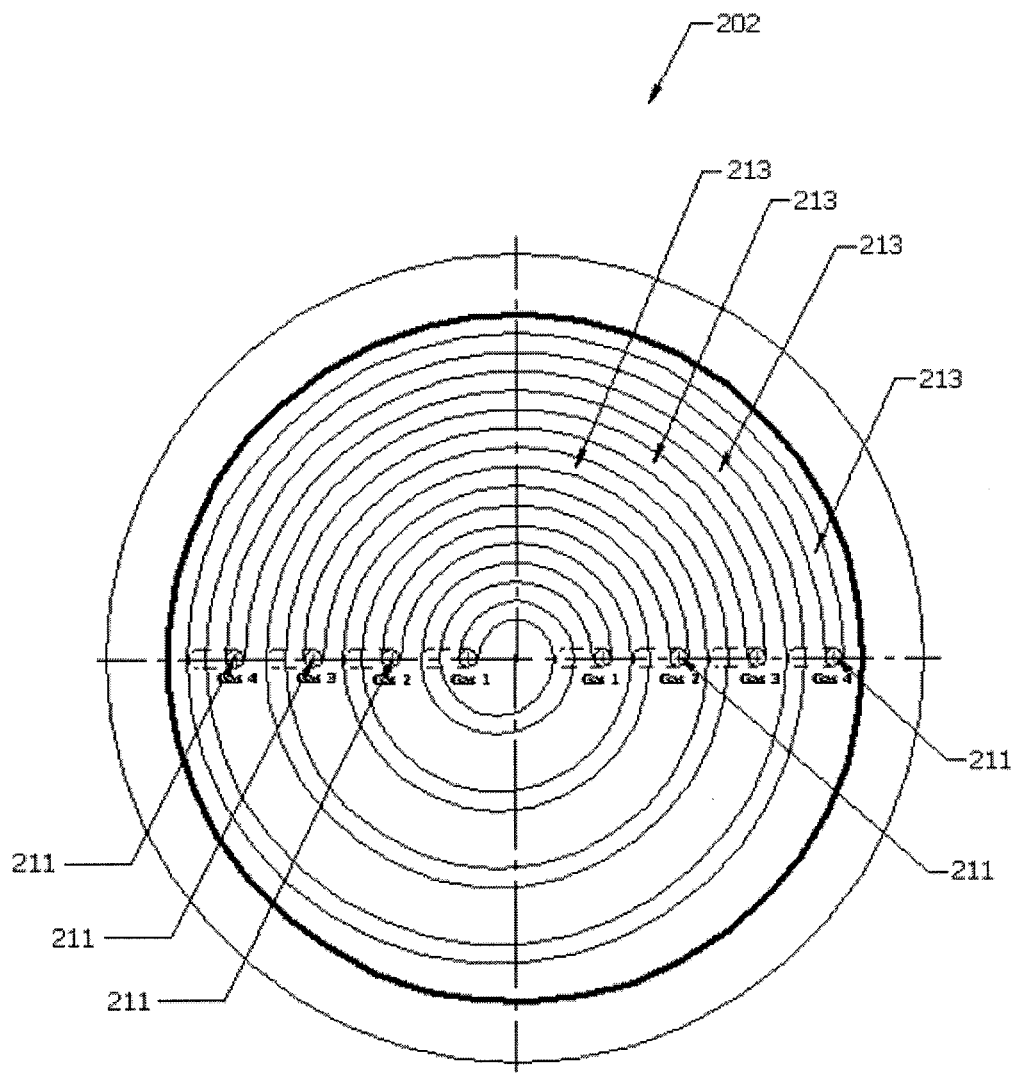

FIGS. 16 to 17 depict a variation of the feed-through apparatus 10 of FIG. 1.

FIG. 16 shows a further feed-through apparatus 200. The feed-through apparatus 200 includes a fixed horizontal gas path plate unit 202, a rotatable vertical feed-through shaft 204, and a plurality of fixed ring ferro-fluidic seals 207. The gas path plate unit 202 is placed at a top part of the feed-through shaft 204. The gas path plate unit 202 is also called a runner unit. The ferro-fluidic seals 207 are placed between the gas path plate unit 202 and the feed-through shaft 204.

As seen in FIG. 17, the gas path plate unit 202 has through-holes 211 and multiple spiral gas paths 213. The through-holes 211 connect a top surface of the gas path plate unit 202 to its bottom surface while the spiral gas paths 213 are arranged on the bottom surface of the gas path plate unit 202. Ends of the spiral gas paths 213 are connected to the through-holes 211. Each through-hole 211 is arranged such that it is in fluid communication with a corresponding gas inlet. The gas inlet is not illustrated in the FIG. 17.

The feed-through shaft 204 has a plurality of gas channels 215, wherein the gas channels 215 have corresponding gas injection inlets 217 and corresponding gas injection holes 219. The gas injection inlets 217 are placed on a top surface of the feed-through shaft 204. The gas injection holes 219 are placed on a bottom surface of the feed-through shaft 204. The gas injection inlets 217 are also called gas transfer shaft orifices while the gas injection holes 219 are also called gas outlet shaft orifices.

The ring ferro-fluidic seals 207 are placed between the gas path plate unit 202 and the top surface of the feed-through shaft 204. Each spiral gas path 213 is also placed between two adjacent ring ferro-fluidic seals 207.

The ring ferro-fluidic seals 207 have circular ring-shaped grooves filled with ferro-fluids for providing sealing between gas inlets and corresponding gas channels.

In use, the ring ferro-fluidic seals 207 are used to seal the gases between the through-holes 211 and the gas injection inlets 217. The lower part of the feed-through shaft 207 is intended for connecting to a spinner.

In summary, the application provides an improved feed-through apparatus for a chemical vapour deposition (CVD) device.

During assembly of the CVD device, the feed-through main body is mounted to a reaction chamber, wherein a portion of the feed-through main body is placed inside the reaction chamber.

In use, the reaction chamber is provided with one or more substrates. Examples of the substrates include semiconductor wafers. The feed-through apparatus is used for delivering fluids, often gases, to the reaction chamber. The reaction chamber allows these fluids to mix and react with each other for producing a thin film of material, which is deposited on the substrates. The reaction chamber also includes one or more outlets for releasing the fluids.

Referring to the feed-through apparatus, it includes a fixed feed-through main body, a plurality of fixed runner units, and a rotatable feed-through device. The feed-through device may include a shaft with a cylindrical body, which can be elongated although other shapes are possible.

Specifically, the feed-through main body may include a plurality of main body fluid inlets. Each main body fluid inlet is intended for connecting to a fluid supply source for receiving a fluid from the fluid supply. The fluid can refer to a gas, to a liquid, or to a mixture of gas and liquid.

The runner units are provided in the feed-through main body. Each runner unit includes a runner fluid inlet and an elongated runner in fluid communication with the runner fluid inlet.

The elongated runner extends spirally on a surface of the runner unit. In a general sense, the surface of the runner unit can refer to an outer surface, to an inner surface, or to both an outer surface and an inner surface of the runner unit. The outer surface is also called an external surface while the inner surface is also called an internal surface. The runner serves as a channel or passageway for receiving fluid from a corresponding runner fluid inlet and for transporting the fluid from one part of the runner to another part of the runner.

The runner fluid inlet may receive the fluid from the main body fluid inlet or receive the fluid directly from the fluid supply.

The rotatable feed-through device comprises and houses a plurality of feed-through device fluid channels. Put differently, the rotatable feed-through device has multiple feed-through device fluid channels, which are provided inside the rotatable feed-through device.

Each feed-through device fluid channel includes at least one feed-through device fluid transfer orifice and at least one feed-through device fluid outlet orifice. The feed-through device fluid transfer orifice is provided for receiving fluid from a corresponding elongated runner. In contrast, each feed-through device fluid outlet orifice is provided for releasing the fluid to a reaction chamber during a chemical vapour deposition process. The fluid is usually released to the reaction chamber via a spinner device.

During assembly of a CVD apparatus, the rotatable feed-through device is attached to the spinner device such that the spinner device is placed in a reaction chamber. The spinner device acts to receive fluids from the feed-through device and to release the fluids outside of the spinner device. The spinner device also rotates for an even distribution of the fluids.

The spiral-elongated runner allows the fluid being transported to a corresponding feed-through device fluid transfer orifice to have less pressure variation. The even pressure allows for even distribution of the fluids by the spinner device, which in turn enables even deposition of material. In applications, like semiconductor wafer fabrication, the even deposition of material is especially important.

Different ways of providing the runner are possible. According to one aspect of the application, the runner is arranged as a spiral slit on a cylindrical element. The slit provides a means for transporting a fluid. The cylindrical element allows easy reception of the feed-through device. According to another aspect of the application, the runner is arranged as a spiral slit on a plane, which is arranged transversely to the rotational axis of the feed-through device. The plane enables for easy production of the spiral slit.

The spiral-elongated runner usually has an elongated body with a first end and a second end. The elongated body provides a means to transport the fluid from one part of the body to another part of the body.

In a general sense, the fluid inlet of the runner unit can be arranged at the first end or the second end of the elongated runner.

The feed-through apparatus normally includes a plurality of sealing devices. The sealing devices are arranged such that they prevent fluid leakages between adjacent runners and corresponding feed-through device fluid transfer orifices. In other words, they seal against fluid leakages. Each runner with corresponding feed-through device fluid transfer orifice is often placed between two adjacent sealing devices. The sealing devices are often provided as magnetic sealing devices, which are able to provide a tight seal.

The feed-through apparatus often includes a spinner device. The spinner device is connected to the feed-through device and it has a plurality of blades with a plurality of blade fluid channels. The blades are often connected radially to a hub. Each blade fluid channel has at least one blade fluid transfer orifice and at least one blade fluid outlet orifice. The blade fluid transfer orifice is provided for receiving fluid from a corresponding feed-through device fluid outlet orifice while the blade fluid outlet orifice is provided for releasing the fluid to the outer side of the spinner device.

After release from the blades, the different fluids react to deposit a thin film of material on a substrate, which is placed below the spinner device.

The feed-through device can include an inner shaft. One end of the inner shaft is attached to the spinner device while the other end of the inner shaft is releasably connected with the feed-through device. Such an inner shaft acts to strengthen the feed-through device.

A pin and groove assembly can be used for releasably connecting the spinner device with the inner shaft. The pin and groove assembly provides a quick way of securing the spinner device to the inner shaft.

A groove and key assembly can be provided at the inner shaft and at the feed-through device for limiting the lowering of the spinner device. In use, the spinner device is located in a reaction chamber. The spinner device is lowered during maintenance of the feed-through apparatus. The lowering of the spinner device is limited to prevent the spinner device from damaging parts of the reaction chamber.

The spinner device can have an alignment protrusion for easy aligning of the inner shaft to the spinner device during assembly.

According to another aspect of the application, the feed-through apparatus has a cooling module for transporting a coolant fluid to the spinner device.

In particular, the feed-through device includes at least one first inner shaft cooling fluid channel and at least one second inner shaft cooling fluid channel.

The first inner shaft cooling fluid channel has at least one first inner shaft cooling fluid transfer orifice and at least one first inner shaft cooling fluid outlet orifice. The first inner shaft cooling fluid transfer orifice is provided for receiving a coolant fluid. Referring to the second inner shaft cooling fluid channel, it comprises at least one second inner shaft cooling fluid transfer orifice and at least one second inner shaft cooling fluid outlet orifice.

The blades of the spinner device have a plurality of first blade cooling fluid channels and a plurality of second blade cooling fluid channels.

Each first blade cooling fluid channel comprises at least one first blade cooling fluid transfer orifice and at least one first blade cooling fluid outlet orifice. Each first blade cooling fluid transfer orifice is provided for receiving the coolant fluid from a corresponding first inner shaft cooling fluid outlet orifice. Similarly, each second blade cooling fluid channel has at least one second blade cooling fluid transfer orifice and at least one second blade cooling fluid outlet orifice.

The spinner device includes a hollow ring being connected to the first blade cooling fluid outlet orifices and to the second blade cooling fluid inlet orifices.

The hollow ring is provided to receive the coolant fluid from the first blade cooling fluid outlet orifices and to transmit the received coolant fluid to the second blade cooling fluid transfer orifices.

Each second blade cooling fluid outlet orifice is provided to transmit the coolant fluid to a corresponding second inner shaft cooling fluid transfer orifice.

The second inner shaft cooling fluid outlet orifice is provided for releasing the coolant fluid.

In short, the coolant fluid flows from the first inner shaft cooling fluid channel, to the first blade cooling fluid channels, to the hollow ring, to the second blade cooling fluid channels, and to the second inner shaft cooling fluid channel.

This arrangement provides a fluid path for cooling the spinner device. The spinner device can be inside a reaction chamber that is running a hot chemical process. The cooling step serves to remove heat from the reaction chamber.

The hollow ring can be connected to outer end parts of the blades. This connection allows for an easy design of the hollow ring.

The application also provides a chemical vapour deposition device. The device includes a chemical reaction chamber, a table with at least one rotatable chuck, and the above feed-through apparatus. The chuck is provided for receiving at least one semiconductor wafer and it is provided in the chemical reaction chamber. The feed-through apparatus is connected with the chemical reaction chamber for providing fluids to the chemical reaction chamber.

The embodiments can also be described with the following lists of features or elements being organized into items. The respective combinations of features, which are disclosed in the item list, are regarded as independent subject matter, respectively, that can also be combined with other features of the application.

Although the above description contains much specificity, this should not be construed as limiting the scope of the embodiments but merely providing illustration of the foreseeable embodiments. The above stated advantages of the embodiments should not be construed especially as limiting the scope of the embodiments but merely to explain possible achievements if the described embodiments are put into practice. Thus, the scope of the embodiments should be determined by the claims and their equivalents, rather than by the examples given.

REFERENCE NUMBERS 10 feed-through apparatus
12 feed-through main body
14 gas inlet
16 rotatable spinner
16' rotatable spinner
17 base plate
18 mounting flange
20 runner unit
20' runner unit
21 spiral runner
23 ferro-fluidic seal
23' ferro-fluidic seal
25 feed-through shaft
27 outer runner carrier
28 inner runner carrier
29 external spiral runner
30 external surface
32 internal spiral runner
34 internal surface
37 internal gas shaft channel
39 gas transfer shaft-orifice
40 gas outlet shaft-orifice
43 inner shaft
43' inner shaft
44 nut
45 nut and bolt assembly
46 washer
47 nut and bolt assembly
49 drive wheel
50 upper bearing
51 lower bearing
53 north ring
54 south ring
56 ring magnet
58 first ferromagnetic fluid layer
60 second ferromagnetic fluid layer
62 radial blade
64 internal gas blade channel
65 gas transfer blade-orifice
67 gas outlet blade-orifice
70 auxiliary extension shaft
72 round ring
75 locking slot
77 central hollow opening
79 sliding groove
81 hub
82 locking pin
89 sliding key
91 first liquid channel
92 second liquid channel
94 first shaft liquid transfer orifice
96 first shaft liquid outlet orifice
98 second shaft liquid transfer orifice
100 second shaft liquid outlet orifice
62a first blade
62b second blade
105 first blade liquid channel
107 first blade liquid channel transfer orifice
109 first blade liquid channel outlet orifice
111 inlet
114 second blade liquid channel
116 second blade liquid channel transfer orifice
117 second blade liquid channel outlet orifice
119 outlet
121 alignment protrusion
200 feed-through apparatus
202 gas path plate unit
204 rotatable feed-through shaft
207 ring ferro-fluidic seal
211 through-hole
213 spiral gas path
215 gas channel
217 gas injection inlet
219 gas injection hole
G1 first precursor gas
G2 second precursor gas
G3 purging gases

The invention claimed is:

1. A feed-through apparatus for a chemical vapour deposition device, the feed-through apparatus comprising:
a feed-through main body;
a plurality of runner units being provided within the feed-through main body, each runner unit comprising
a fluid inlet for receiving a fluid, and
an elongated runner in fluid communication with the fluid inlet that is operative to receive the fluid from the fluid inlet, and the elongated runner extending spirally on a surface of the runner unit; and
a feed-through device rotatable with respect to the plurality of runner units, the feed-through device comprising a plurality of feed-through device fluid channels, each feed-through device fluid channel comprising at least one feed-through device fluid transfer orifice and at least one feed-through device fluid outlet orifice, each feed-through device fluid transfer orifice being in fluid communication with a corresponding elongated runner during rotation of the feed-through device that is operative to receive fluid from the corresponding elongated runner, each feed-through device fluid outlet orifice being provided for releasing the fluid into a reactor chamber, wherein the elongated runner is operative to transport the fluid to the feed-through device through the elongated runner.

2. The feed-through apparatus according to claim 1, wherein each elongated runner is arranged as a spiral slit on a cylindrical element.

3. The feed-through apparatus according to claim 1, wherein each elongated runner is arranged as a spiral slit on a plane that is transverse to the rotational axis of the feed-through device.

4. The feed-through apparatus according to claim 1, wherein each elongated runner comprises a first end and a second end.

5. The feed-through apparatus according to claim 4, wherein the fluid inlet of each runner unit is arranged at the first end of the elongated runner.

6. The feed-through apparatus according to claim 5, wherein each runner unit further comprises another fluid inlet arranged at the second end of the elongated runner for receiving fluid.

7. The feed-through apparatus according to claim 1 further comprising a plurality of sealing devices for preventing against fluid leakages between adjacent runner units and corresponding feed-through device fluid transfer orifices.

8. The feed-through apparatus according to claim 1 further comprising a spinner device being connected to the feed-through device, the spinner device comprising a plurality of blades with a plurality of blade fluid channels, each blade fluid channel comprising at least one blade fluid transfer orifice and at least one blade fluid outlet orifice, each blade fluid transfer orifice being provided for receiving fluid from a corresponding feed-through device fluid outlet orifice, and each blade fluid outlet orifice being provided for releasing the fluid into the reactor chamber.

9. The feed-through apparatus according to claim 1, wherein the feed-through device comprises an inner shaft, one end of the inner shaft is attached to the spinner device, and the other end of the inner shaft is releasably connected with the feed-through device.

10. A feed-through apparatus for a chemical vapour deposition device, the feed-through apparatus comprising:
a feed-through main body;
a plurality of runner units being provided within the feed-through main body, each runner unit comprising
a fluid inlet for receiving a fluid, and
an elongated runner in fluid communication with the fluid inlet that is operative to receive the fluid from the fluid inlet, and the elongated runner extending spirally on a surface of the runner unit; and
a feed-through device rotatable with respect to the plurality of runner units, the feed-through device comprising a plurality of feed-through device fluid channels, each feed-through device fluid channel comprising at least one feed-through device fluid transfer orifice and at least one feed-through device fluid outlet orifice, each feed-through device fluid transfer orifice being in fluid communication with a corresponding elongated runner during rotation of the feed-through device for receiving fluid from the corresponding elongated runner, each feed-through device fluid outlet orifice being provided for releasing the fluid into a reactor chamber, wherein the feed-through device comprises an inner shaft, one end of the inner shaft is attached to the spinner device, and the other end of the inner shaft is releasably connected with the feed-through device; and a pin and groove assembly is provided for releasably connecting the spinner device with the inner shaft.

11. The feed-through apparatus according to claim 9, wherein a groove and key assembly is provided at the inner shaft and at the feed-through device for limiting the lowering of the spinner device.

12. A feed-through apparatus for a chemical vapour deposition device, the feed-through apparatus comprising:
a feed-through main body;
a plurality of runner units being provided within the feed-through main body, each runner unit comprising
a fluid inlet for receiving a fluid, and
an elongated runner in fluid communication with the fluid inlet that is operative to receive the fluid from the fluid inlet, and the elongated runner extending spirally on a surface of the runner unit; and
a feed-through device rotatable with respect to the plurality of runner units, the feed-through device comprising a plurality of feed-through device fluid channels, each feed-through device fluid channel comprising at least one feed-through device fluid transfer orifice and at least one feed-through device fluid outlet orifice, each feed-through device fluid transfer orifice being in fluid communication with a corresponding elongated runner during rotation of the feed-through device for receiving fluid from the corresponding elongated runner, each feed-through device fluid outlet orifice being provided for releasing the fluid into a reactor chamber, wherein the feed-through device comprises an inner shaft, one end of the inner shaft is attached to the spinner device, and the other end of the inner shaft is releasably connected with the feed-through device; and the spinner device comprises an alignment protrusion for aligning the inner shaft to the spinner device during assembly.

13. The feed-through apparatus according to claim 1, wherein the feed-through device further comprises:
at least one first inner shaft cooling fluid channel, the first inner shaft cooling fluid channel comprising at least one first inner shaft cooling fluid transfer orifice and at least one first inner shaft cooling fluid outlet orifice, wherein the first inner shaft cooling fluid transfer orifice is provided for receiving a coolant fluid, and
at least one second inner shaft cooling fluid channel, the second inner shaft cooling fluid channel comprising at least one second inner shaft cooling fluid transfer orifice and at least one second inner shaft cooling fluid outlet orifice,
a spinner device comprising blades, wherein the blades of the spinner device comprise:
a plurality of first blade cooling fluid channels, each first blade cooling fluid channel comprising at least one first blade cooling fluid transfer orifice and at least one first blade cooling fluid outlet orifice, wherein each first blade cooling fluid transfer orifice is provided for receiving the coolant fluid from a corresponding first inner shaft cooling fluid outlet orifice, and
a plurality of second blade cooling fluid channels, each second blade cooling fluid channel comprising at least one second blade cooling fluid transfer orifice and at least one second blade cooling fluid outlet orifice, and the spinner device further comprising:

a hollow ring being connected to the first blade cooling fluid outlet orifices and to the second blade cooling fluid transfer orifices, wherein the hollow ring is provided to receive the coolant fluid from the first blade cooling fluid outlet orifices and to transmit the coolant fluid to the second blade cooling fluid transfer orifices, wherein each second blade cooling fluid outlet orifice is provided for transmitting the coolant fluid to a corresponding second inner shaft cooling fluid transfer orifice, and the second inner shaft cooling fluid outlet orifice is provided for releasing the coolant fluid.

14. The feed-through apparatus according to claim 13, wherein the hollow ring is connected to outer end parts of the blades.

15. A chemical vapour deposition device comprising:

a chemical reaction chamber;

a table with at least one chuck for receiving at least one semiconductor wafer, the table being provided in the chemical reaction chamber; and a feed-through apparatus according to claim 1, wherein the feed-through apparatus is connected with the chemical reaction chamber.

\* \* \* \* \*